United States Patent [19]

Carr

[11] 4,238,760
[45] Dec. 9, 1980

[54] MULTI-SPECTRUM PHOTODIODE DEVICES

[75] Inventor: William N. Carr, Dallas, Tex.

[73] Assignee: Recognition Equipment Incorporated, Irving, Tex.

[21] Appl. No.: 949,346

[22] Filed: Oct. 6, 1978

[51] Int. Cl.³ .......................................... H01L 27/14
[52] U.S. Cl. ...................................... 357/30; 357/23; 357/41; 357/55
[58] Field of Search ...................... 357/30, 55, 23, 41; 250/211 J

[56] References Cited

U.S. PATENT DOCUMENTS

| | | | |
|---|---|---|---|
| 3,478,214 | 11/1969 | Dillman | 250/211 |
| 3,812,518 | 5/1974 | Kurz et al. | 357/30 |
| 3,964,083 | 6/1976 | Lohstroh | 357/30 |
| 4,011,016 | 3/1977 | Layne | 356/195 |
| 4,048,649 | 9/1977 | Bohn | 357/43 |
| 4,084,175 | 4/1978 | Ouyang | 357/55 |
| 4,109,270 | 8/1978 | Basse | 357/23 |

*Primary Examiner*—Martin H. Edlow
*Attorney, Agent, or Firm*—John E. Vandigriff

[57] ABSTRACT

One or more photoelectric device elements are formed beneath the surface of a monolithic semiconductor structure below a surface photoelectric detector device to form a plurality of photoelectric devices having different spectral responses. The surface element is responsive to visible light and the one or more subsurface devices are sensitive to longer wavelength radiation depending upon the depth of the device below the surface of the structure. A two dimensional array of the devices may be formed in a single semiconductor wafer to provide a self-scanning multi-element photosensor array.

6 Claims, 12 Drawing Figures

LEGEND:
- DUF- DIFFUSION UNDER FILM
- DEEP COLLECTOR DIFFUSION
- SURFACE P- MASK
- BURIED SURFACE CONTACTS
- POLYSILICON GATES/INTERCONNECT
- METAL CONTACTS
- METALLIZATION

LEGEND:
- BURIED PHOTODIODE
- V-GROOVE GATE
- P-MASK
- BURIED SURFACE CONTACTS
- POLYSILICON GATES/ INTERCONNECT
- METAL CONTACTS
- METALLIZATION

MULTI-SPECTRUM PHOTODIODE DEVICES

FIELD OF THE INVENTION

This invention relates to semiconductor devices more particularly to multi-spectrum photodiode devices formed in a monolithic semi-conductor structure to provide two or more photodiode devices having different responses to different wavelengths of radiation.

DESCRIPTION OF THE PRIOR ART

In general, to provide different spectral responses, photodiodes have been covered with various coatings to provide filters which pass only certain wavelengths of radiation. In other words, filters have been provided over the devices which block out certain wavelengths of radiation and passes other wavelengths. Individual devices have been used which have to be mechanically aligned which is difficult when the devices are fairly small. In U.S. Pat. No. 3,962,578 two photoelectric detector elements have been used where one is mounted on top of the other and one device plus coatings provide a filter for the second device. Such a device is not convenient to use particularly when large two dimensional arrays are required for self scanning detection, for example, in the optical reading of characters. Furthermore, alignment problems are inherent in such devices. Each device in the array would have to be mechanically aligned with the device over which it is mounted.

In the construction of the multi-spectrum devices prior techniques in making other semiconductor devices have been used. For example, a substrate material may have an epitaxial layer of a different type material thereon and buried layers of opposite conductivity material may be formed between the two layers. The buried layer being induced, for example, by ion implantation, or formed on the substrate by diffusion prior to the formation of the epitaxial layer.

Contact to the second device may use prior art techniques such as forming a V-groove in the surface of the device which groove extends down to the buried layer, diffusion within the V-groove and/or depositing material therein to make contact with the buried layer.

SUMMARY OF THE INVENTION

Documents used in document processing system use different types of ink such as fluorescent ink, infrared ink, or other inks which may have still different spectral responses. For example, in the processing of checks, data may be imprinted over the checks. The imprinted information may not be clear because of other data printed on the check or because of various colored backgrounds on the checks. The information printed thereon may not be completely readable due to interference from other colors. Therefore, it is desirable to be able to imprint with inks of different spectral response and then to read these inks.

In optical character readers the data lift system generally consists of either one or two dimensional self scanned arrays photosensitive elements. It is desirable for the above reasons for these photosensitive elements to be able to read different spectral responses and to detect the different inks imprinted on the document.

The present invention includes a device which may be formed in a monolithic semiconductor wafer which includes two or more devices of two or more spectral responses. The devices may be perfectly aligned through the photo process used in producing the semiconductor device. Therefore, mechanical alignment of the photosensitive elements is not required when mounted within the optical character reading machine.

The use of multi-level sensor cells, when compared with beam-splitting techniques provides increased total sensitivity for the 400 to 950 nm range and increased spatial resolution results because in split-beam optic image focus degradation occurs.

A surface photodiode is formed and then one or more subsurface diodes are formed under the surface photodiode. The subsurface photodiodes have different spectral responses depending on the depth it is buried within the semiconductor substrate. The various photodiodes are produced by known processes used in manufacturing of semiconductor devices. For example, a buried photoelectric device may be formed by ion implanting a region beneath the surface of the device or a diffused region may be formed prior to the expitaxial growth of a layer over the semiconductor substrate. Diffusion and contact methods are used which are well known in the semiconductor art.

BRIEF DESCRIPTION OF THE DRAWINGS

The invention and technical advances represented thereby will be better understood when the following description taken in conjunction with the drawings which are.

DESCRIPTION OF THE INVENTION

Figure 1:
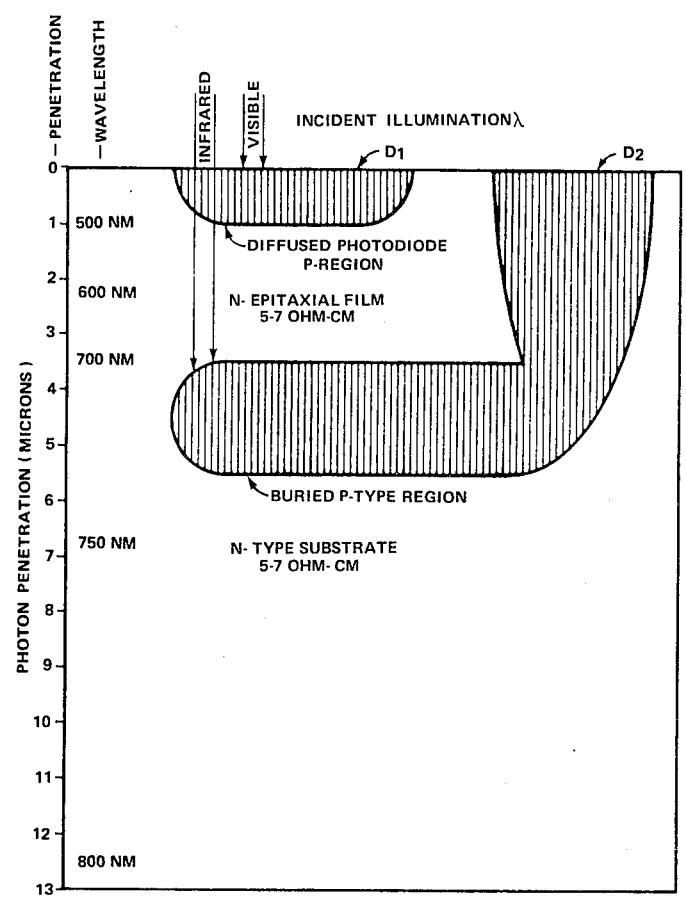
FIG. 1 illustrates the penetration depth of photons into silicon with the cross section of two diodes according to the present invention.

The sharply increasing optical absorption coefficient of silicon for wavelengths in the visible and infrared range result in visible wavelength photons being absorbed near the silicon surface and infrared wavelengths photons penetrate further into the bulk silicon before absorption occurs. Therefore, photodiodes placed at the surface tend to response to visible photons and photodiodes placed deeper into the silicon bulk respond more to the infrared penetrating photons. This effect is shown schematically in FIG. 1 in which the absorption wavelength for photons of varying wavelengths is shown. For example, the absorption length of 500 nanometers (nm) illumination is approximately one micron. Illumination at 750 nm is 65% absorbed at 6.5 micron depth. By positioning a buried photodiode D2 under the surface photodiode D1, a cell structure results with separate visible and infrared photo responsivity. Present day technologies of silicon epitaxial crystal growth coupled with diffusion, ion implantation, and etching control make a photo-array cell possible. Since well known semiconductor processing techniques are used to produce the multi-spectrum device, details of the actual semiconductor process for making the device will not be explained in detail.

The basic photodevice used in photodiode arrays is a shallow P-N junction near the surface, ohmic contacts to the diffused area and substrate together with appropriate voltage biasing circuitry.

Self-scanned arrays are fabricated with a boron, p-type diffusion into silicon n-type substrate of resistivity 4-to-7 ohm-cm. The diode static characteristic follows the diode equation.

$$I = I_o[\exp(qV_F/kT) - 1] - I_\lambda \tag{1}$$

where:

$$I_o = q n_i^2 \left( \frac{1}{N_A} \sqrt{\frac{D_n}{\tau_n}} + \frac{1}{N_D} \sqrt{\frac{D_p}{\tau_p}} \right) \tag{2}$$

and $I_\lambda = qG_\lambda A_j$ photocurrent generation.

$A_j$ is the diode active area. The parameter $V_F$ is forward diode bias. $\tau_n$ and $\tau_p$ are electron and hole lifetimes. Other parameters are standard semiconductor physics notation.

The hole-electron generation rate for incident photons penetrating x-distance into silicon is given by $$G(x) = \Phi_o \alpha \exp(-\alpha x) \tag{3}$$

where $\Phi_o$ is incident light flux (photons/cm$^2$).
$\alpha$ is the optical absorption coefficient (cm$^{-1}$).

The number of minority carriers M that diffuse a distance x to the P-N junction at x=d from photoabsorption sites is similarly given.

$$M(D) = G(x)\exp[-|d-x|/L] \tag{4}$$

From Equations 3 and 4, the photocurrent collected at the junction location x=d due to volume (electron) generation in the P-region is $M_p$.

$$M_P(d) = \Phi_o \int_0^d \alpha \exp(-\alpha x) \exp(x - d)/L_n \, dx \tag{5}$$

or $$M_P(d) = \Phi_o \frac{\alpha L_n}{\alpha L_n - 1} [\exp(-\alpha d) - 1] \tag{6}$$

When the contribution $M_p$ from the substrate n-region is added, the total collection rate M at the diode junction x=d becomes $$M(d) = M_P(d) + M_n(d) \tag{7}$$

and the resultant photocurrent from Equations 6 and 7 is:

$$I = q \Phi_o \alpha A_j \left\{ \exp(-\alpha d) \left[ \frac{L_n}{\alpha L_n - 1} + \frac{L_p}{\alpha L_p + 1} \right] - 1 \right\} \tag{8}$$

where $I_\lambda = qM(d)A_j$ \hfill (9)

The terms with $L_n$ are surface dominated effects while those with $L_p$ are bulk hole carrier generation. One can associate the $L_n$ and $L_p$ terms very approximately with visible and infrared photoresponse.

When Equation 9 is expressed in terms of minority carrier lifetime $\tau$ and carrier diffusivity D, using Equation 10.

$$L = \sqrt{D\tau} \tag{10}$$

we obtain $$I_\lambda = \tag{11}$$
$$q \Phi_o \alpha A_j \left\{ \exp(-\alpha d) \left[ \frac{\sqrt{D_n \tau_n}}{\alpha \sqrt{D_n \tau_n}} + \frac{\sqrt{D_p \tau_p}}{\alpha \sqrt{D_p \tau_p} + 1} \right] - 1 \right\}$$

For photodiodes with very small bulk lifetime $\tau_p$, the photocurrent becomes:

$$I_\lambda = q \Phi_o \alpha A_j \left( \frac{\sqrt{D_n \tau_n}}{\alpha \sqrt{D_n \tau_n} - 1} - 1 \right) \exp(-\alpha d) \tag{12}$$

Furthermore, for photodiodes of very low lifetime $\tau_p$, the photocurrent is expressed as:

$$I_\lambda = q \Phi_o \alpha A_j \frac{\sqrt{D_p \tau_p}}{\alpha \sqrt{D_p \tau_p} + 1} \exp(-\alpha d) \tag{13}$$

These equations do not take into account secondary effects including depletion layer thickness and recombination current within the depletion region.

For individual array diodes in a 12×38 array, the dark current $I_o$ in Equation 1 was measured to be less than 2 picoamps for most processed devices. The result is a dark current $I_o$ two orders of magnitude reduced from those photocurrents $I_\lambda$ obtained at nominal illumination levels $\Phi_{nom}$.

The theory for the dual-spectrum epitaxial array cell requires consideration of photoabsorption at the different penetration depths and selective collection of the generated carriers by photodiodes D1 and D2.

The carrier generation above the surface diode D1 and below the buried diode D2 each contribute entirely to these two respective diode photocurrents.

Carrier generation in the epitaxial volume between the two photodiodes contributes partially to both diodes D1 and D2.

There are three bulk volumes that contain carrier generation sites in the simple model used for the analysis in this report:

| | |
|---|---|
| Volume 1 | $0 < x < d_1$ |
| Volume 2 | $d_1 < x < d_2$ |
| Volume 3 | $d_2 < x < d_3$ |

Where the two photodiode junctions are at depths of $d_1$ and $d_2$ below the silicon surface $x=0$. The total silicon slice thickness is $d_3$, where $d_3$ can generally be considered infinite for practical calculations. When photocollection from these three volumes is expressed as a modification of Equation 5, one obtains for the surface diode collections of $M_1$:

$$M_{1p}(d_1) = \Phi_o a \int_0^{d_1} \exp(-ax) \exp\left[\frac{(x-d)}{L_n}\right] dx \quad (14)$$

and $$M_{1n}(d_1) = \frac{1}{2} \Phi_o a \int_{d_1}^{d_2} \exp(-ax) \exp -\left[\frac{(d_1 - x)}{L_p}\right] \quad (15)$$

where:

$$M_1 = M_{1p} + M_{1n} \quad (16)$$

Similarly, the collection $M_2$ at the buried diode $x = d_2$ has two contributions, neglecting the width of the buried layer:

$$M_{2na}(d_2) = \frac{1}{2} \Phi_o a \int_{d_1}^{d_2} \exp(-ax) \exp\left[\frac{(x - d_2)}{L_p}\right] dx \quad (17)$$

and $$M_{2nb}(d_2) = \frac{1}{2} \Phi a \int_{d_2}^{\infty} \exp(-ax) \exp -\left[\frac{(x - d_2)}{L_p}\right] dx \quad (18)$$

where:

$$M_2 = M_{2na} + M_{2nb} \quad (19)$$

The optical absorption process here is spontaneous without wavecoupling. The hole-electron pairs in the epitaxial region $d_1 < x < d_2$ diffuse isotropically in a $4\pi$ stearadian pattern from each statistical generation site.

A more detailed analysis for the epitaxial cell will include the photocurrent contributions due to recombination within the depletion regions and the buried p-type film.

The calculation for photocurrents in the dual-spectrum, lateral cell requires modification of the incident flux to include the filtering effect of the overlaying polysilicon.

$$\Phi_o^1 = T_F(\lambda)\Phi_o \quad (20)$$

Where $T_F(\lambda)$ is the spectral transmission of the polysilicon film and $\Phi_o^1$ is the filtered illumination entering the silicon surface. For the dual spectrum, lateral cell, the photocurrent in the infrared cell becomes:

$$I_\lambda = \quad (21)$$

$$q \Phi_o^1 a A_j \left\{ \exp(-ad) \left[ \frac{\sqrt{D_n \tau_n}}{\sqrt{D_p \tau_p} - 1} + \frac{\sqrt{D_p \tau_p}}{\sqrt{D_p \tau_p} + 1} \right] - 1 \right\}$$

where $A_j$ is the illuminated diode area.

The device illustrated in FIG. 1 shows a surface diode $D_1$ formed by a p-type diffusion into a p-type epitaxial layer on an n-type substrate. Buried p-type region in the n-substrate forms the buried diode $D_2$. A diffusion makes contact with the buried region.

Figure 2:
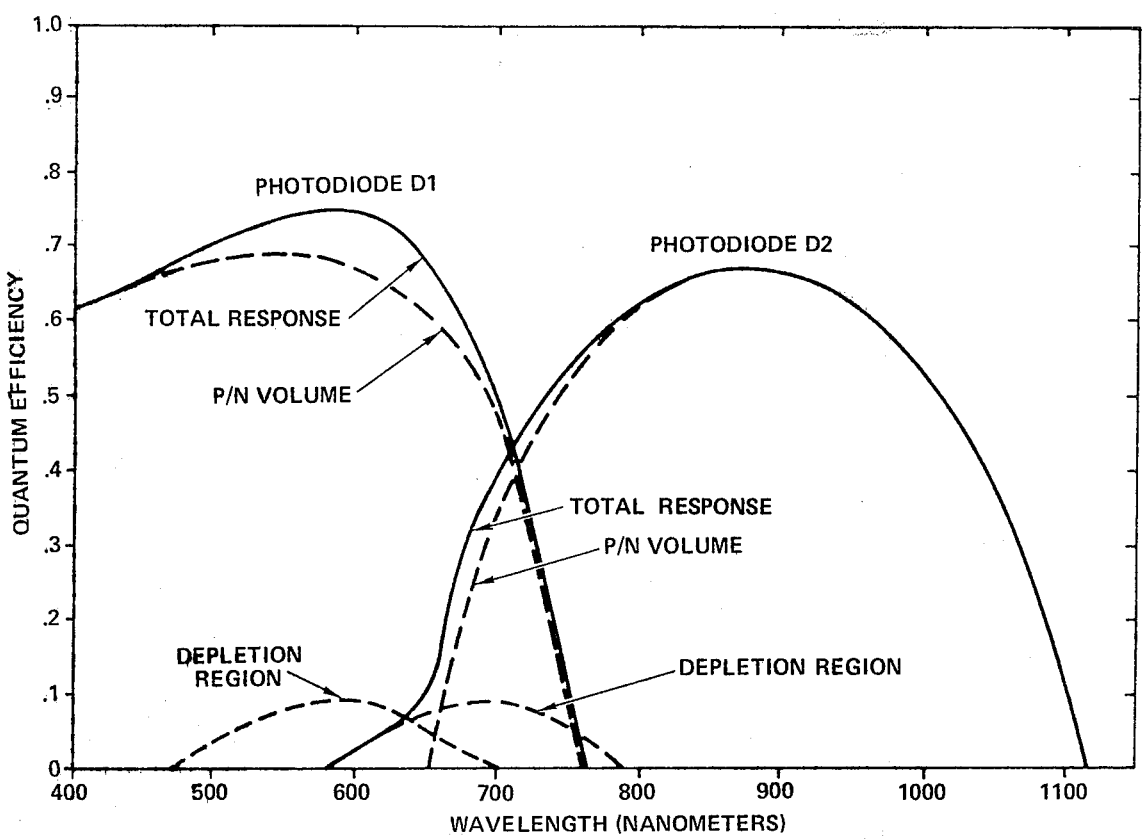
FIG. 2 illustrates the estimated component quantum efficiencies for the two photodiode elements shown in FIG. 1.
Figure 3:
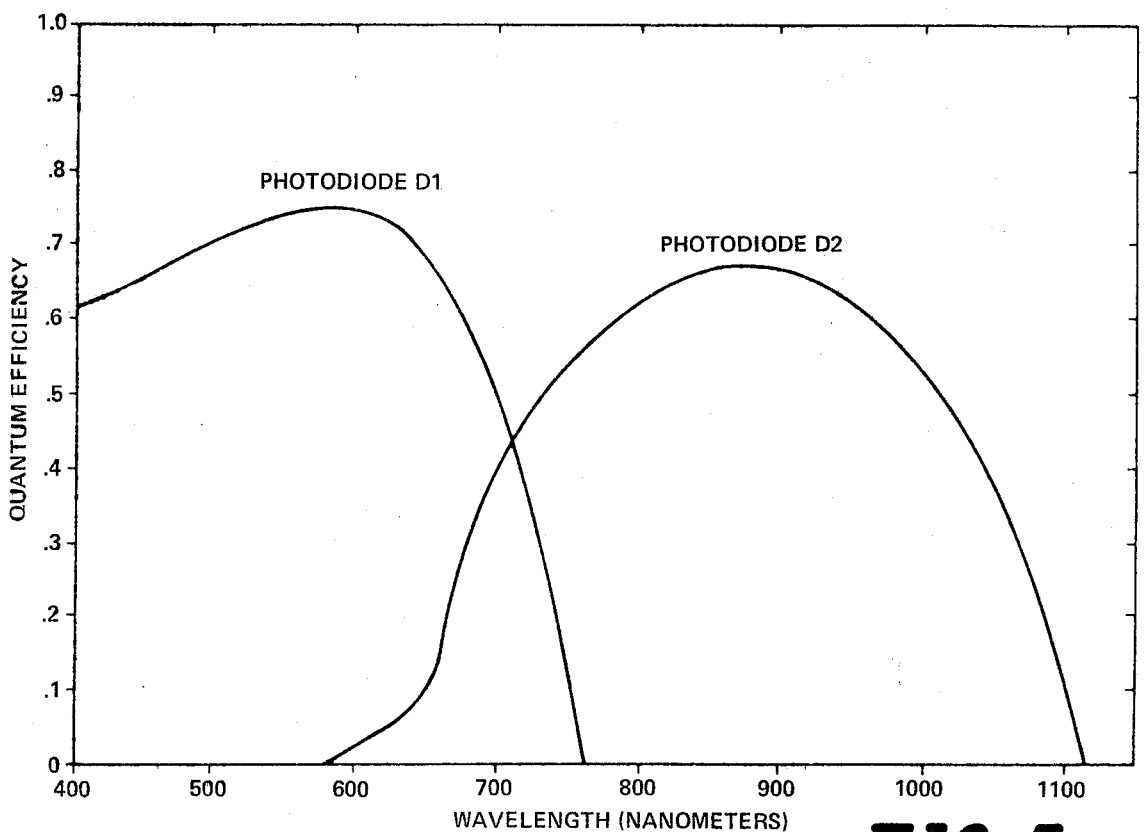
FIG. 3 illustrates the total response plotted from the estimated components of two photodiodes.

The quantum contributions from the semiconductor bulk and the two diode regions of FIG. 1 are shown in FIG. 2. The resulting quantum of efficiency is shown in FIG. 3 for the surface diode D1 and buried diode D2. The filtering action of the silicon is evident in causing a shift in quantum efficiency for the photodiode D2 into the infrared region. The structure illustrated in FIG. 1 gives the following advantages: separate responsivity output for the visible and infrared spectrum; geometrical alignment of the visible and infrared sensitive areas, separate infrared response at no reduction in surface visible response, detection array system with simultaneous or multiplexed visible/infrared video, array processing for immediate comparison of OCR of blind inks versus carbon based inks, and array processing for immediate comparison of visible versus infrared for OCR.

Figure 4:
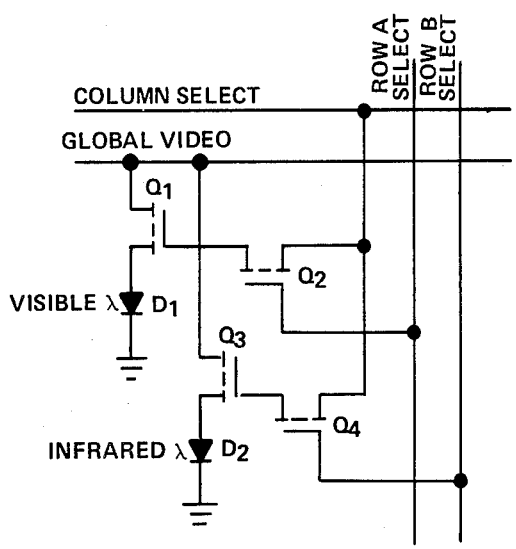
FIG. 4 illustrates schematically two epitaxially formed diode elements according to present invention.

FIG. 4 is the schematic diagram of two "piggy-back" diodes with separate visible and infrared response. The column select in row A select line are those which would normally be used for a semiconductor photodiode array. For the second buried diode a row B select line is added with transistors Q3 and Q4. A common video line is used to provide output into the OCR system.

Transistors Q1 and Q2 are used to gate the video from diode D1 and transistors Q3 and Q4 are used to gate the video of D2 to the video line.

Figure 5:
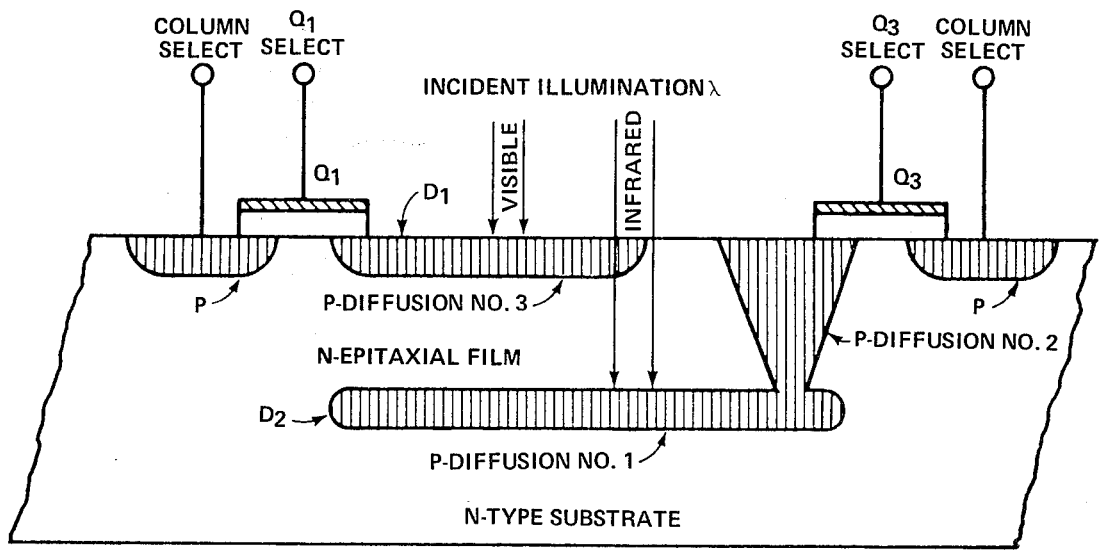
FIG. 5 illustrates two diodes in cross section and a epitaxial element with a deep collection diffusion.

FIG. 5 is a cross section of a semiconductor device incorporating the features of the circuits shown in FIG. 4. Standard surface MOS transistors are used at the Q1 to Q4 positions. A buried diode is obtained by a diffusion or ion implant into the substrate and then covering it with an epitaxial film. Contact with the buried photodiode is obtained by a deep diffusion similar to the diffusion-under-film collector contact diffusion common in bipolar IC processing and used for reducing the parameter $R_{cs}$. As illustrated, the visible spectrum will be detected by the photodiode D1, and the infrared spectrum would be detected by the diode D2. The column select lines are P diffusions into the epitaxial layer.

Figure 6:
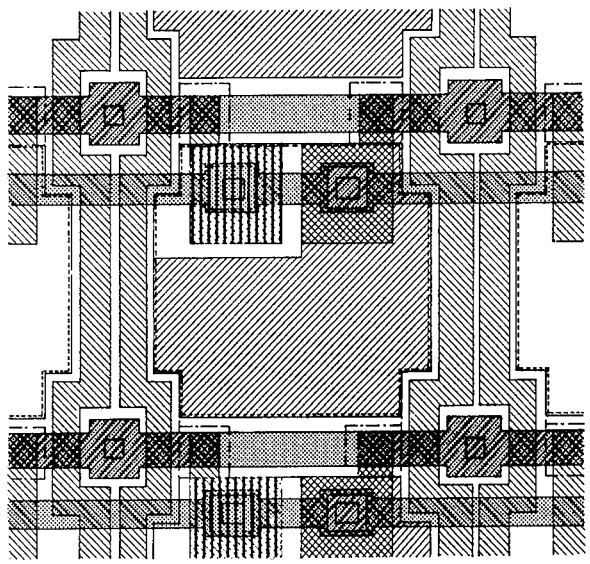
FIG. 6 illustrates a specific masking layout to implement a dual spectrum diode pair.

To further illustrate how the device of FIG. 5 would be constructed, FIG. 6 shows a specific masking layout to implement the dual spectrum cells of FIG. 4 and 5. A seventh mask is used to define the deep diffusion to the photodiode. The masking layout can be implemented on 4 mil centers with a slight reduction in the photodiode area to make space for the one added row address line. Each of the various regions are identified by the legend shown in FIG. 6.

Figure 7:
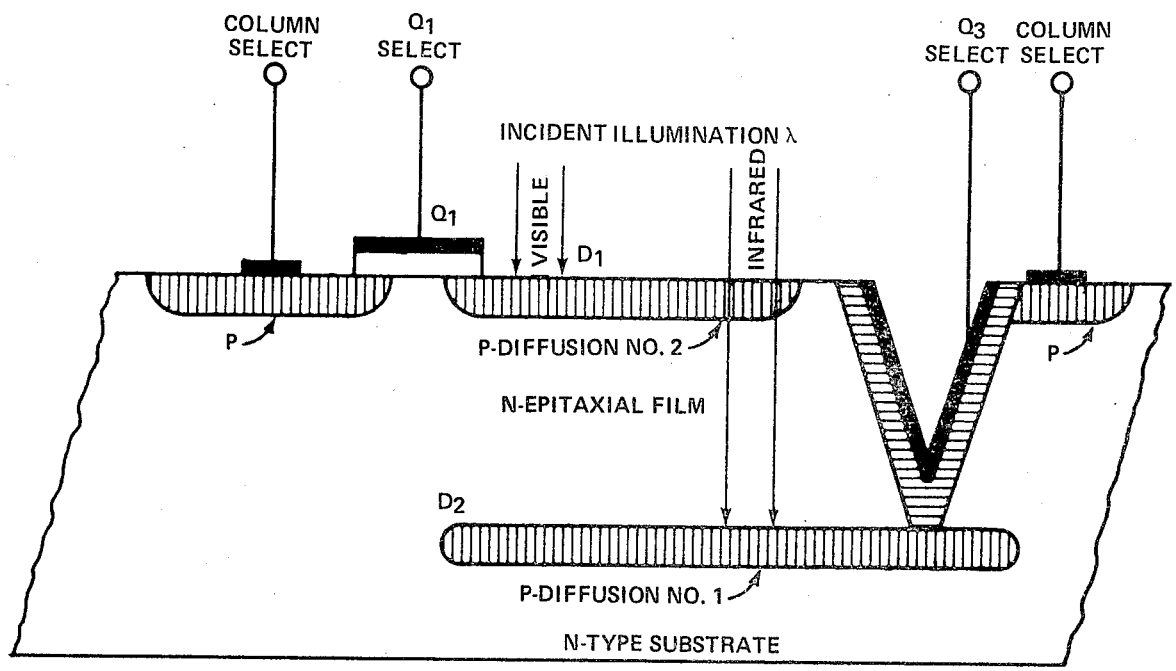
FIG. 7 illustrates a dual spectrum array of two photodiode devices with a single V-groove making contact with the buried diffusion region.

FIG. 7 is a cross sectional view of the semiconductor device in which a V-groove MOS transistor is used. An advantage of the V-groove technology in contacting the buried diffused region is providing the MOS device while contacting the buried P diffusion number 1 which forms a part of diode D2. The buried layer is contacted by the V-groove which has been etched to the correct depth.

Figure 8:
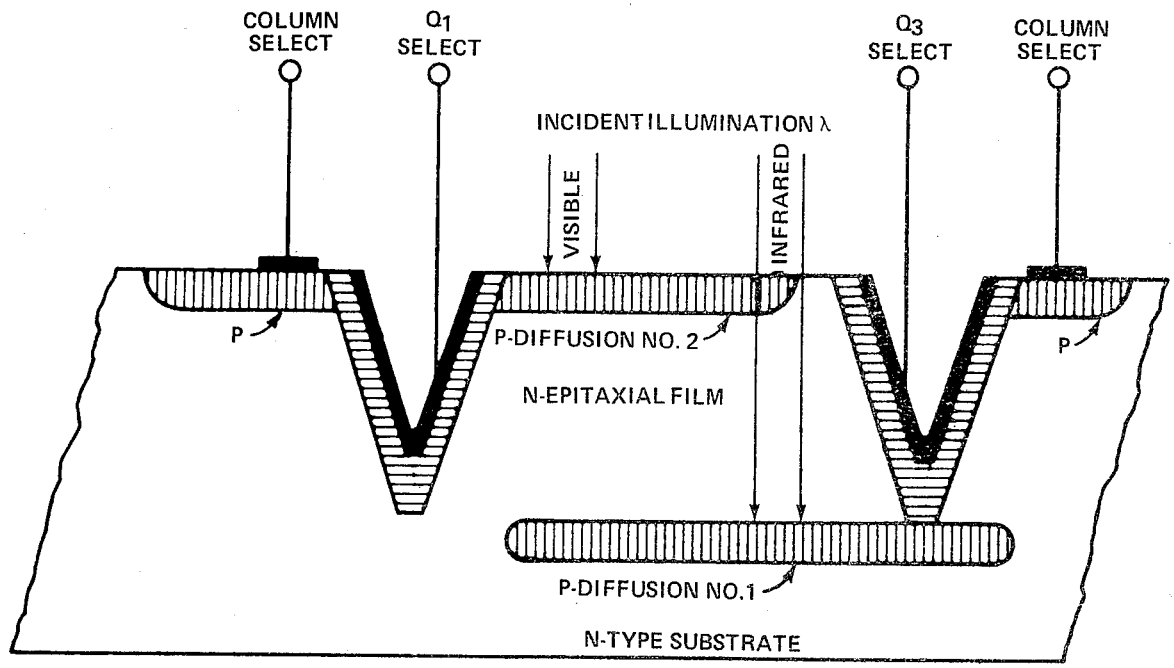
FIG. 8 illustrates a dual spectrum epitaxial photodiode element with a double V-groove.

The dual spectrum cell illustrated in FIG. 4 can also be implemented with V-groove transistors at all four positions as illustrated in FIG. 8. Since the V-groove transistor requires less lateral area compared with the standard silicon-gate MOS transistor, more area within the cell is available for the active photodiodes. The buried photodiode D2 is selected by the V-groove MOS transistor in the left half area of the cell. The one V-groove transistor requires an extra mask for channel definition. The cell can be designed with 4 mil by 4 mil array spacing or other desired spacings. The processing for the device in FIG. 8 requires 7 photo mask levels plus protective passivation and is compatible with present day V-groove technology.

Another option for obtaining infrared response enhancement is to cover a photodiode with a sufficiently thick film of polysilicon. The covering of polysilicon film does not have the sharp absorption versus wavelength cutoff of single crystal silicon, but does permit an approximate visible filter. Another disadvantage of cell with covering polysilicon film for is that the total spectral response is reduced 50% compared with the buried diode design.

Figure 9:
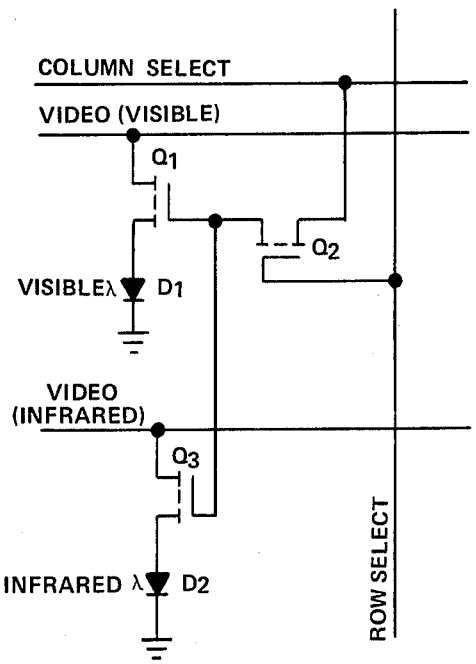
FIG. 9 illustrates a dual spectrum photodiode element schematic with separate video output lines.
Figure 10:
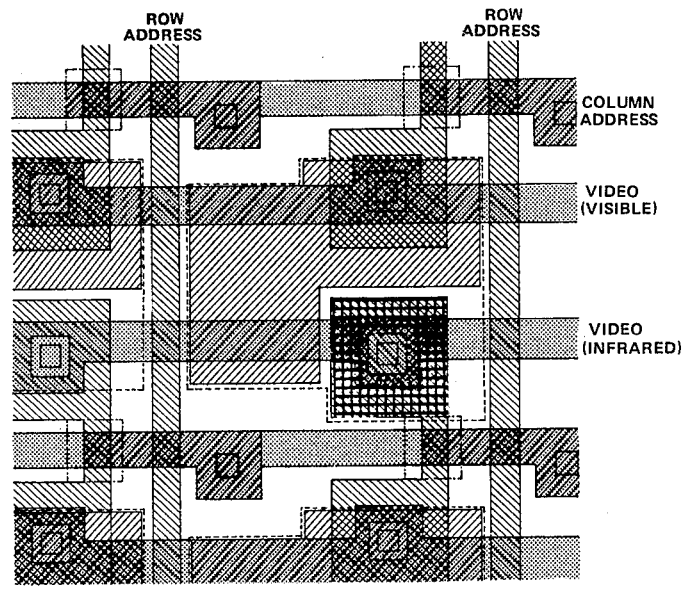
FIG. 10 is a photo mask composite of the dual spectrum photodiode element schematic with separate video output lines.

In forming the multi-spectrum diode into arrays it is necessary to bring the video from each diode to an output line. A separate line may be used for each diode or preferably a single video line is used. Output from each diode is multiplexed into the single video line. The use of a single video output line reduces the shadow that would be caused by a second video port. Addressing of the cell for time multiplexing video into a single line output port is relatively simple. However, if a second video output port is required, it may be as illustrated in FIG. 9. A composite mask layout for a dual video port device is shown in FIG. 10.

Figure 11:
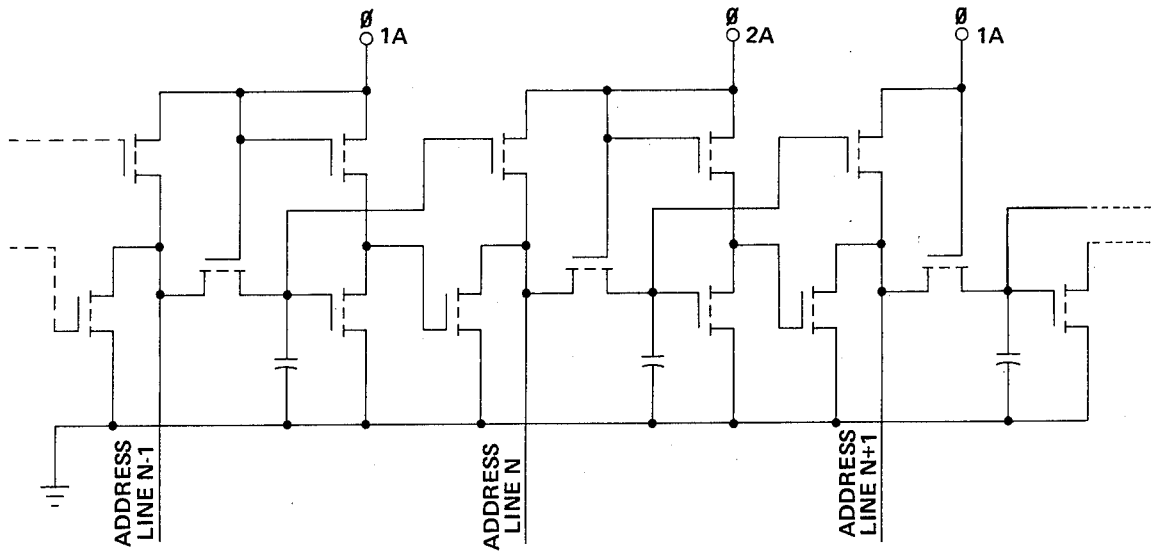
FIG. 11 is a dual spectrum epitaxial array shift register schematic diagram.

Since in optical character recognition systems an array of diodes is used, it is necessary to have row address lines. A single row address shift register for use with the dual video port array cell of FIG. 9 is illustrated in FIG. 11. The address circuit of FIG. 11 uses 5 transistors per delay element. The complete dual array and all address and control elements may be formed in a semiconductor device using known integrated circuit design techniques and processes.

Figure 12:
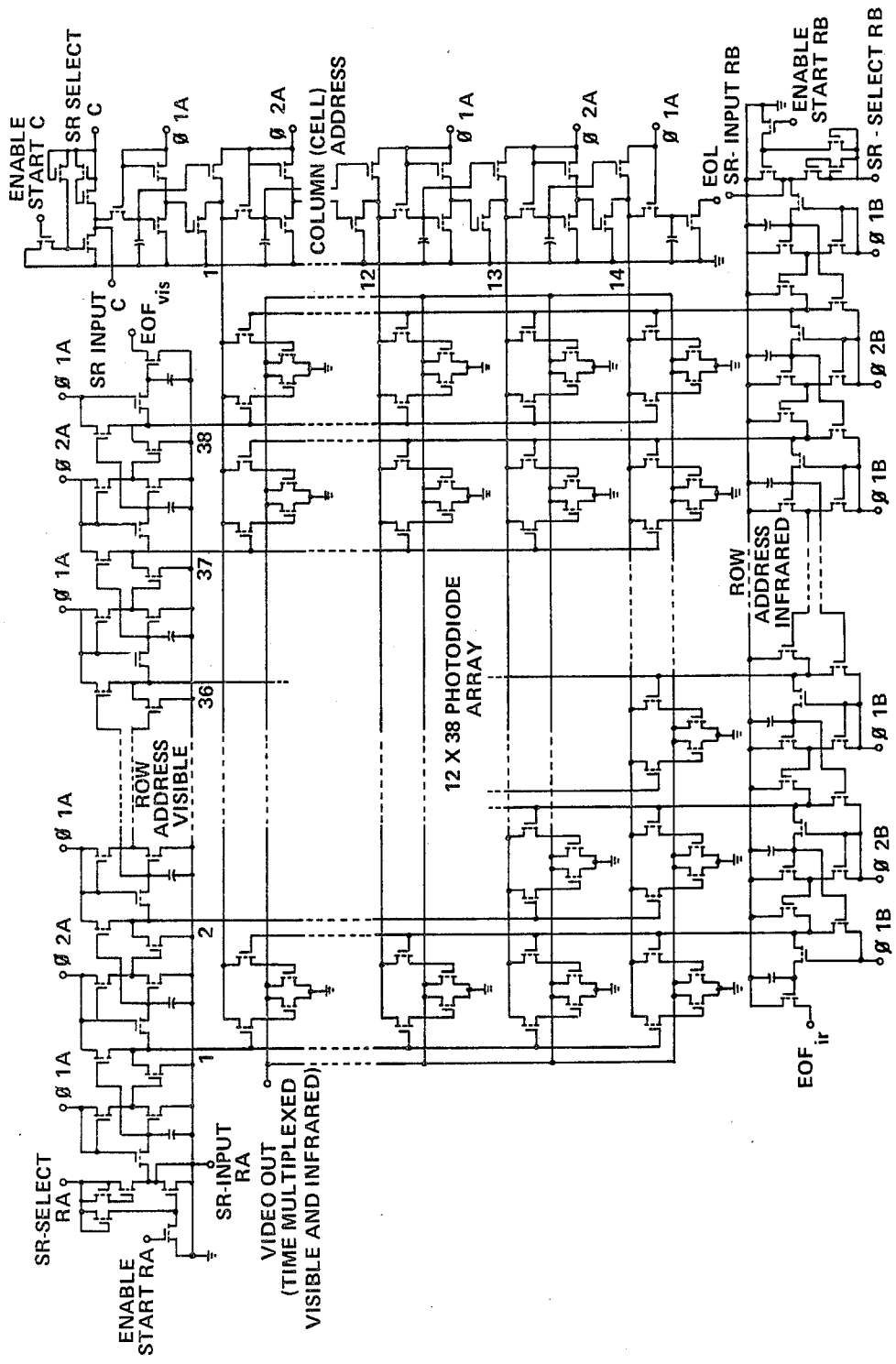
FIG. 12 is a schematic of a dual spectrum array of 12 by 38 elements.

To illustrate a complete photodiode array utilizing the dual spectrum diodes a schematic of a 12 by 38 array is shown in FIG. 12. This circuit shows a dual spectrum of two separate row address shift registers in a schematic layout with a single video port. The entire circuit may be implemented on a single semiconductor body.

In summary it has been shown that dual spectrum photodiodes may be formed in a single semiconductor body for detecting and reading data having different wavelengths. Such devices may be extended to have 3 photodiodes, one each responsive to the red, green and blue spectra thereby using an array of such devices as an image pickup device with integral color separation. With present day technology these devices are feasible and an entire array with row and a column addressing circuits for multi-spectral output implemented within a single semiconductor body.

Having shown and discussed specific implementations of the above the described invention, futher modifications will become evident which fall within a scope of the appended claims.

What is claimed is:

1. A multi-spectrum photodiode device having at least one photodiode pair, each photodiode of the pair operable independent of the other and sensitive to a different wavelength of radiation comprising:
a body of semiconductor material of one conductivity type having an epitaxial layer of the same conductivity type on one face thereon; a diffused region of an opposite conductivity type in said body of semiconductor material at said one face under said epitaxial layer and forming a first photodiode therewith, a second diffused region of said opposite conductivity type in said epitaxial layer and forming a second photodiode therewith, said second photodiode being directly over but spaced apart from said first photodiode, a third diffused region of said opposite conductivity type in said epitaxial layer, extending through said layer to said first diffused region and providing contact thereto; and contact to said second diffused region to facilitate output from said second photodiode independent of the output from said first photodiode.

2. The photodiode device according to claim 1 including means for gating the output from each of the photodiodes.

3. The device according to claim 2 wherein said means for gating includes a semiconductor gate at the output from each photodiode.

4. An N×M array of pairs of photodiode according to claim 1 formed in rows and columns including gating means for sequentially gating the outputs from said photodiode on a row by row or column by column basis.

5. The array according to claim 4 wherein the array and gating means is formed on a single semiconductor chip.

6. A photodiode device comprising a plurality of vertically aligned photodiodes, one photodiode being formed at the surface of a semiconductor chip and the other of said plurality of vertically aligned photodiodes being found one under the other within the body of the semiconductor chip, each of the photodiodes producing an output independent of the other through contacts and conducting regions extending into the body of the semiconductor chip to each of said photodiodes.

* * * * *